United States Patent
Hana et al.

(10) Patent No.: US 6,282,042 B1
(45) Date of Patent: Aug. 28, 2001

(54) DATA PROCESSING APPARATUS AND METHODS

(75) Inventors: Andrew Hana, Bristol; Christopher Huw Williams, Wales; Stephen Paul Langford, Bristol, all of (GB)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 08/934,765

(22) Filed: Sep. 22, 1997

(30) Foreign Application Priority Data

Sep. 24, 1996 (EP) .................................. 96306939

(51) Int. Cl.⁷ .............................. G11B 15/14; G11B 5/09
(52) U.S. Cl. ................... 360/64; 360/46; 700/94
(58) Field of Search .................. 700/94; 360/46, 360/47, 48, 64–65, 69, 70; 364/32, 69

(56) References Cited

U.S. PATENT DOCUMENTS

| | | | |
|---|---|---|---|
| 4,646,326 | 2/1987 | Backof, Jr. et al. | 375/39 |
| 4,922,530 * | 5/1990 | Kenney et al. | 379/411 |
| 5,231,547 * | 7/1993 | Noguchi et al. | 360/70 |
| 5,258,933 | 11/1993 | Johnson et al. | 364/602 |
| 5,276,566 * | 1/1994 | Clifford, Jr. | 360/64 |
| 5,345,342 | 9/1994 | Abbott et al. | 360/48 |
| 5,355,328 | 10/1994 | Arbeiter et al. | 364/724.1 |
| 5,361,174 * | 11/1994 | Seki et al. | 360/46 |
| 5,422,760 * | 6/1995 | Abbot et al. | 360/46 |
| 5,513,215 * | 4/1996 | Marchetto et al. | 375/233 |
| 5,896,067 * | 4/1999 | Williams | 331/17 |
| 6,078,614 * | 6/2000 | Brown et al. | 375/232 |

FOREIGN PATENT DOCUMENTS

| | | |
|---|---|---|
| 0293773 | 12/1988 | (EP) . |
| 0420269 | 4/1991 | (EP) . |
| 0 527 579 A1 | 2/1993 | (EP) . |
| 0595454 | 5/1994 | (EP) . |

* cited by examiner

Primary Examiner—Xu Mei

(57) ABSTRACT

An adaptive filter 24 for filtering a signal comprising first streams interspersed with second streams (for example the A and B tracks of a signal retrieved from a tape storage device) comprises respective stores for storing initial filter coefficients for each type of stream. The corresponding coefficients are loaded for the beginning of each stream. The stored coefficients for each stream may be a standard set, or they may be from the adaption process of one or more previous streams of that type. The coefficients may be taken part way through the adaption process, in a minimum error portion of the stream.

8 Claims, 4 Drawing Sheets

DATA PROCESSING APPARATUS AND METHODS

TECHNICAL FIELD

This invention relates to data processing apparatus and methods, and to electronic circuits for use in connection therewith. In particular, but not exclusively, the invention relates to apparatus and methods for retrieving data stored using a DDS Data Storage System. The invention also extends in general to apparatus and methods for processing data in one or more communications channels.

BACKGROUND ART

It is already known to provide reliable storage and retrieval of large volumes of digital data, such as computer data, in particular by means of the DDS (Digital Data Storage) format defined in ISO/IEC standard 12247.

In a DDS read/write mechanism using the above format, data are recorded on an elongate recording media, comprising a tape coated with a magnetic medium, by a rotating drum carrying one or more electro-magnetic heads. The tape is moved by a motor-driven capstan along a path extending between two spools or reels and wrapped partially around the drum. The plane of rotation of the heads of the drum is disposed at an angle to the plane of movement of the tape, so that each head traverses the tape along successive diagonal tracks extending across the width of the tape at an angle to its centre line. The mechanism includes appropriate circuitry for encoding data into signals suitable for recording onto tape, including error-detection and correction codes, and for conditioning of those signals into a form which is optimally matched to the characteristics of the recording media. For data retrieval, additional circuitry is provided for detecting magnetic field variations stored on the tape, deriving corresponding signals, conditioning those signals into a form suitable for subsequent processing, decoding the encoded data and detecting and correcting errors.

In a current format (DDS-2), data are recorded at a bit density of approximately 61 kilobits per inch (kbpi) (equivalent to approximately 24 kilobits per centimeter). At this bit density, a typical DDS tape cartridge can currently store up to approximately 8 gigabytes of data, using the longest practicable tape and techniques such as data compression to maximise the quantity of data the tape can accommodate. With the steadily increasing use of computer equipment and the volumes of data processed and stored by such equipment, it has become desirable to increase the capacity of a DDS tape cartridge still further.

The assignee of this invention is in the process of developing a new format (DDS-3) which further increases the storage capacity by doubling the linear recording density and increasing the proportion of a recorded track that is available for user data. Together, these improvements are estimated to provide about three times the data capacity of DDS-2, for a cartridge of given tape length. The DDS-3 format, when recorded on the longest practicable tape, is designed to provide a storage capacity of 12 gigabytes of uncompressed user data or typically 24 gigabytes of compressed user data.

Reference is directed to the commonly assigned, previously published International Patent Application WO95/15551 for further details of this scheme, the contents of the earlier Patent Application being incorporated herein by reference.

Because the linear bit density in DDS-3 is twice that of DDS-2, the bit spacing on the-tape is approximately one half of the gap of the preferred read head. This means that the output signal from the read head, instead of varying between two discrete levels (+1,−1) varies; between three levels (+2,0,−2), and as such, DDS-3 will be a 3-level system.

It is proposed to recover recorded data by means of a partial-response maximum-likelihood (PRML) data recovery channel.

"Partial Response" denotes a practicable Partial Response signalling scheme which only requires up to the Nyquist frequency bandwidth for data transmission, by enforcing deterministic intersymbol-interference at the detector input. An example is the PR-1 (or duobinary) Partial Response system (recording channel transfer function) which is described by the discrete time transfer function $F(D)=D+1$. Other examples such as class IV or PR-4 exist, and we do not exclude these possibilities.

"Maximum Likelihood" denotes a Maximum Likelihood Detection decoding scheme, implementing a Viterbi algorithm, which chooses the most likely sequence of output data, using a sequence of received samples, instead of just one received sample at a time.

In the read-mode of a typical proposed scheme for DDS-3, the approximately equalised signal is taken and is subjected to Automatic Gain Control to establish and stabilise the signal amplitudes, and then to full Adaptive Equalisation to a combined PR-1 target. In the Adaptive Equalisation step, an adaptive, sampled finite impulse response filter is used to provide a three-level PR-1 target transfer function. In one embodiment, after Adaptive Equalisation, the signal undergoes analogue to digital conversion, followed by three-level Viterbi (or Maximum Likelihood) detection. In order to do this, clock information is extracted from the input signal and used to synchronise the Adaptive Equaliser, the analogue to digital converter, and the Viterbi decoder. In another embodiment, the Adaptive Equalisation is, instead, be performed after analogue to digital conversion.

As in previous DDS formats, in the proposed DDS-3 format, data are stored in a series of tracks of alternate azimuth (referred to as the A track and B track respectively). Each end of each track is occupied by a margin region which is expendable, the front margin being followed by a preamble region, which is often indistinguishable from the margin. The preamble region is normally a plain sinusoidal tone and does not carry any data, but exists to enable the AGC loop and the clock recovery loop to achieve fast lock-on and also to identify the start of the main data region. A preamble detector controls the Adaptive Equaliser to ensure that the channels do not try to adapt the preamble or margin regions, because otherwise they will not be optimised for the data portion.

In this Specification, the term communications channel is used broadly to include channels of data retrieved from a recorded medium.

SUMMARY OF THE INVENTION

In DDS-3, we propose to use an adaptive filter which we refer to herein as a feed-forward equaliser (FFE). At the start of each track, the FFE is loaded with a set of initial coefficient values; as the read head transverses the track, the coefficient values adapt to a set of stable values (which can vary from track to track) to minimise the difference between the actual filter output and the ideal output, which in DDS-3 is one of the values +2, 0, −2. In a 3-level signal system as used in DDS-3, there are several possible stable sets of filter coefficient values, but only one of which is actually the desired set which produces a decodable data sequence.

Although it might be thought that a common set of FFE starting coefficients for both the A and B tracks would quickly adapt to the correct values, we have found that there is a significant difference between the spectral characteristics of the A and B tracks and we have found that, by storing separate sets of coefficients for each of the A and B tracks, we can provide a considerably improved adaption process.

Whilst we have discussed this with reference to DDS-3, it will be appreciated that the invention extends to other systems which process data certain of whose characteristics may be predictable. Also, this aspect of the invention also extends to other types of communication channel and not just to those derived from a recorded medium.

Accordingly, in one aspect, this invention provides a sampled time filter apparatus for processing a signal, said signal comprising a succession of streams of data of a first characteristic interspersed with streams of data of a second characteristic, said sampled time filter apparatus having means for storing a plurality of filter coefficients corresponding to streams of said first characteristic, and means for storing a plurality of filter coefficients corresponding to streams of said second characteristic, and means for applying the respective plurality of coefficients for filtering the corresponding stream.

It will be appreciated that the signal may comprise two or more streams of data interspersed in a regular or random order. In one embodiment the streams of data comprise the A and B tracks of data from a digital data storage tape machine, where the A and B tracks alternate. This aspect of the invention might also be used, for example, to process streams of data of different characteristics received from a satellite communications system.

In this aspect the coefficients suitable for the stream may quickly be applied, allowing smooth and stable adaption to the first or second characteristics.

The same plurality of filter coefficients may be used repeatedly for a stream of a particular characteristic. The adapted set of coefficients is taken part way through the streams and stored ready for a following stream of the same characteristic.

In another aspect of this invention there is provided a method of applying sampled time filtering to a signal retrieved from a recording medium, said signal comprising a succession of streams of data of a first characteristic interspersed with streams of data of a second characteristic, which comprises storing a plurality of filter coefficients corresponding to streams of said first characteristic, storing a plurality of filter coefficients corresponding to streams of said second characteristic, and using the respective plurality of coefficients for filtering the corresponding stream.

According to a further aspect, this invention provides a sampled time filter apparatus for processing a signal comprising a plurality of streams of data, said sampled time filter apparatus having store means for storing a plurality of filter coefficients, means for adapting said coefficients in response to the output of said filter apparatus, and initialising means for applying to said store means an adapted set of coefficients corresponding to a selected portion of one or more previous streams.

Preferably, said initialising means applies an adapted set of coefficients corresponding to a minimum error portion of one or more previous streams. For example, said initialising means may apply an adapted set of coefficients corresponding to those at a preselected interval after commencement of adaption of a previous stream.

Alternatively, said initialising means may apply an adapted set of coefficients obtained from a combination of sets of coefficients from a plurality of previous streams, and said combination may comprise an average of sets of coefficients from previous streams.

Whilst the invention has been described above, it extends to any of the features set out above or in the following description.

BRIEF DESCRIPTION OF THE DRAWINGS

The invention may be performed in various ways and, by way of example only, an embodiment of the invention will now be described in detail, reference being made to the accompanying drawings in which.

DESCRIPTION OF THE PREFERRED EMBODIMENT

The data storage apparatus now to be described utilises a helical-scan technique for storing data in oblique tracks on a recording tape in a format similar to that used for the storage of PCM audio data according to the DATC Conference Standard (June 1987, Electronic Industries Association of Japan, Tokyo, Japan). The present apparatus is, however, adapted for storing computer data rather than digitised audio information. In conventional manner the apparatus includes a helical-scan tape deck in which magnetic tape passes at a pre-determined angle across a rotary head drum whilst the head drum is rotated. The head drum houses a pair of diametrically opposed read heads and a pair of diametrically opposed write heads at 90° to the read heads. In known manner, these heads in use write overlapping oblique tracks across the tape, with the tracks written by one head having a positive azimuth and those written by the other head having a negative azimuth.

The tracks are used to store data provided to the apparatus (main data) together with items of auxiliary information known as sub-codes which relate, for example, to the logical organisation of the main data, its mapping onto the tape, certain recording parameters (such as format identity, tape parameters etc.) and tape usage history. The tracks also contain synchronisation bytes ("sync bytes") to enable data byte boundaries to be identified, and which are used to generate timing signals for controlling tape movement etc. At the beginning and end of each track are margin regions and there is a preamble block between the beginning margin and the main data area.

Figure 1:
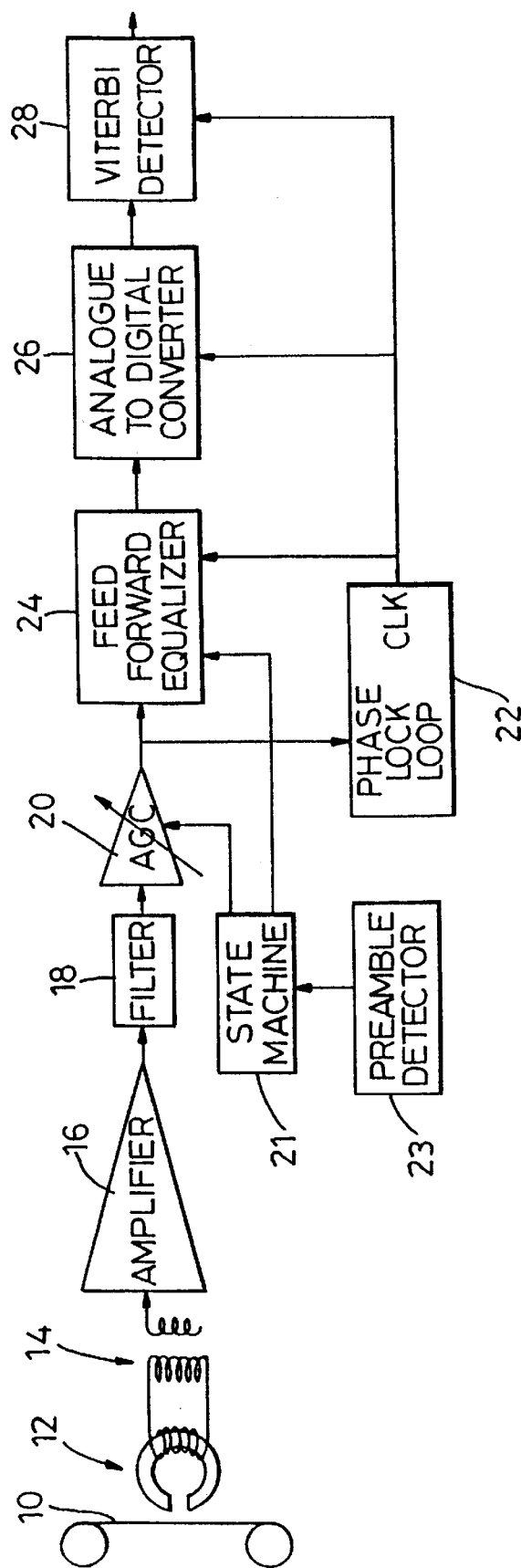
FIG. 1 is a schematic block diagram of the main components of an embodiment of a data retrieval apparatus incorporating apparatus in accordance with this invention.

Referring now to FIG. 1, data stored on tape 10 is read by a read-head 12 on the main drum and the signal passes via a rotary transformer 14 to an amplifier 16 and thence to a filter 18 for initial approximate equalisation to a combined PR-1 target. In practice a differential signal is taken from the read head, rather than making one end grounded. FIG. 1, however, shows just one signal line. The signal is then supplied to an automatic gain control (AGC) circuit 20 for establishing and stabilising the +2 and −2 amplitudes of the three-level signal received from the filter and integrator 18. The signal from the AGC circuit 20 is supplied to a phase lock loop (PLL) 22 for recovery of a clock signal and is also passed to an adaptive filter referred to herein as a feed forward equaliser (FFE) 24 which provides adaptive equalisation to a combined PR-1 target, so that the overall channel frequency response matches the characteristic of an ideal PR-1 partial response channel. The filtered signal is supplied to an analogue to digital converter (ADC) 26 which produces a digitised version of the filtered signal, for supply to a Viterbi detector 28. The output of the Viterbi detector 28 is an NRZI-encoded data stream. In other embodiments, the feed forward equaliser 24 may be located after the analogue to digital converter instead of before it.

Figure 2:
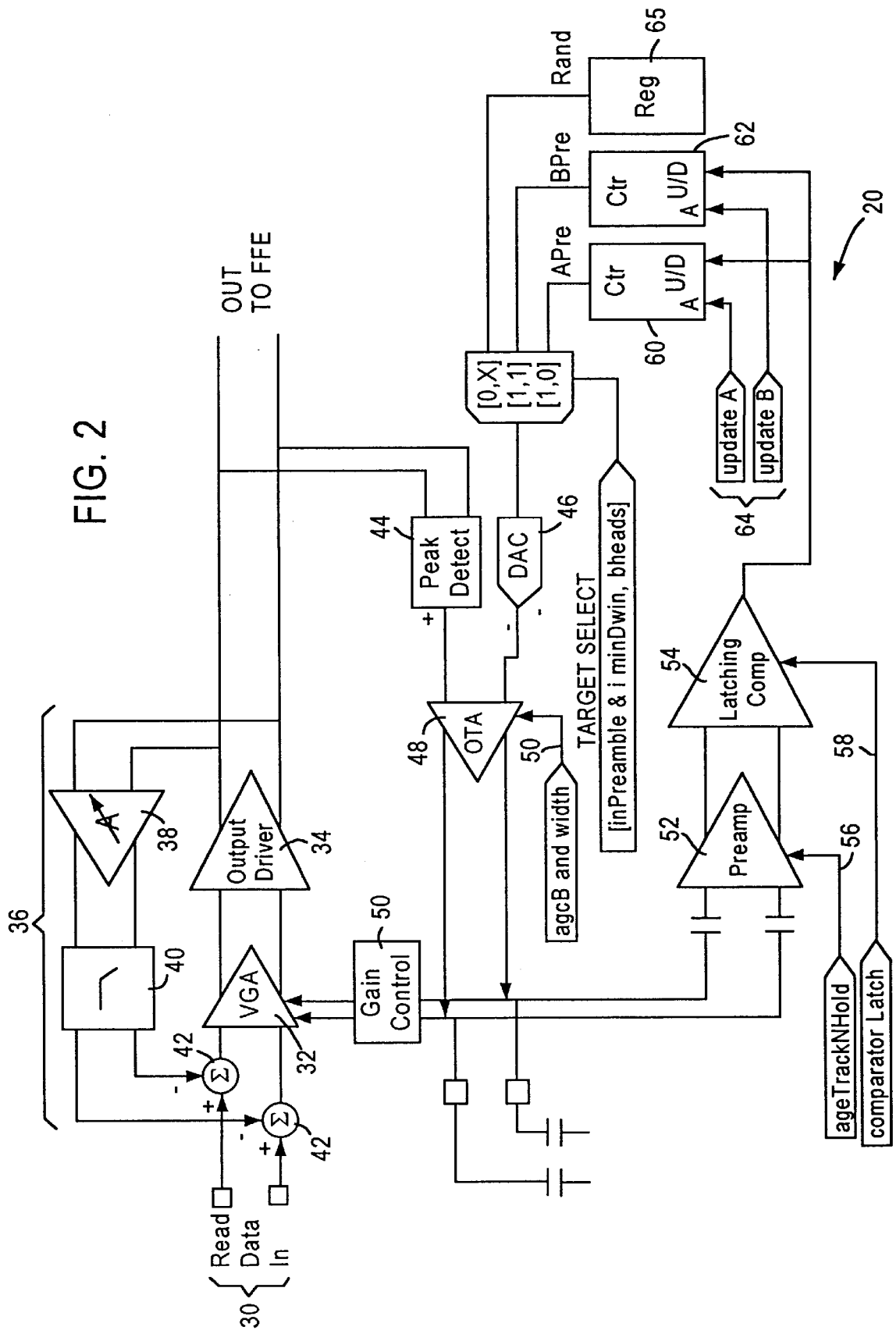
FIG. 2 is a block diagram of an automatic gain control system forming part of the apparatus of FIG. 1.

Referring now to FIG. 2, the automatic gain control system is shown here in more detail and the two differential signal lines are evident.

In operation, the automatic gain control system serves to present a constant signal amplitude to the FFE 24 to within a specified nominal amplitude. For ideal operation, this amplitude must not vary along the length of any one track, or between tracks of the same azimuth. Within the bounds of a specified absolute gain error, it does not matter what the signal amplitude is, as long as it remains substantially constant. The variation of the amplitude of the VGA 32 during any transient behaviour of the AGC control loop must be controlled to within a pre-set relative gain error, which is much smaller than the absolute gain error. The recorded track comprises zones of differing spectral characteristics. The most important of these zones are the preamble regions and the random data regions. For ideal operation downstream of the AGC block 20, the AGC system, when taken as a whole, must be immune to changes in frequency spectrum. The relative amplitude tolerance must not be exceeded on either side of the boundary between preamble regions and random data regions.

The signal is input on lines 30 to the voltage gain amplifier (VGA) 32 and the output passes via an output driver 34 to pass onwards to the ADC 26 or FFE 28 (not shown in FIG. 2). A feedback loop 36, comprising an amplifier 38, a low pass filter 40 and summers 42 is provided for DC offset control. The output from the output driver 34 also passes to a common, simple peak detector 44 which detects peaks in the output signal. The output of the peak detector 44 is supplied together with a target value from a digital to analogue converter (DAC) 46 to an operational transconductance amplifier (OTA) 48 (the VGA control voltage) acts as a comparator.

The output of the amplifier 48 (the VGA control voltage is supplied to a gain control 50 which supplies the gain control signal to the VGA 32. The gain control loop defined by the peak detect circuit 44, amplifier 48 and gain control 50 has a relatively fast response time.

The output of the amplifier 48 is also supplied to a pre-amplifier 52 and latching comparator 54, which tracks a measure $VGA_1$ of the VGA control voltage at or immediately before the interface between the preamble region and the main data region, and then holds it. A second measure $VGA_2$ of the VGA control voltage is taken a number of channel bits later (i.e. at the beginning of the main data region). A direct comparison of $VGA_1$ and $VGA_2$ reveals whether the gain of the voltage gain amplifier 32 has increased or decreased in making the transition between the preamble region and the random data region. Based on this information, an appropriate counter 60;62 holding the preamble target for the peak detector of the appropriate A or B track is incremented or decremented. Adjustment of the preamble target is enabled and disabled via line 64. A register 65 holds a constant value for the random data target for the peak detector 44 under all conditions. The response of the target control loop is slower than that of the gain control loop.

After an initial training period, the preamble target will have adapted to equalise the VGA control voltages immediately prior to and after the interface between the preamble region and the main data region, separately for the A and B tracks with respective target values held in counters 60 and 62, ready for the next track.

Thus, in this circuit, the differing response of a simple peak detector 44 to preamble and random data is adaptively calibrated out. The preamble target counters 60 and 62 are saturating counters which will not overflow or underflow, and so, if one currently holds its maximum count and is asked to increment, it will maintain its maximum count. Similarly, if it holds its minimum count and is asked to decrement, it will maintain the minimum count.

The bandwidth or response time of the target control loop may be adjusted between preset values by adjusting the bandwidth mode of the OTA amplifier 48 on line 50. The preamble regions of the A and B tracks exist to enable the clock recovery loop and AGC loop to achieve fast lock-up on data of known properties, and as such the regions are short. The bandwidth of the AGC system is selected to be high at the start of the preamble region to facilitate this fast lock-up. Once coarse amplitude settling has been achieved, medium bandwidth mode may be selected on line 50 until accurate gain amplitude settling has been achieved. Then low bandwidth mode is selected prior to the arrival of the random data so that excessive signal modulation by the VGA control voltage is avoided.

By this arrangement the gain can be controlled sufficiently accurately for the processing downstream.

Figure 3:
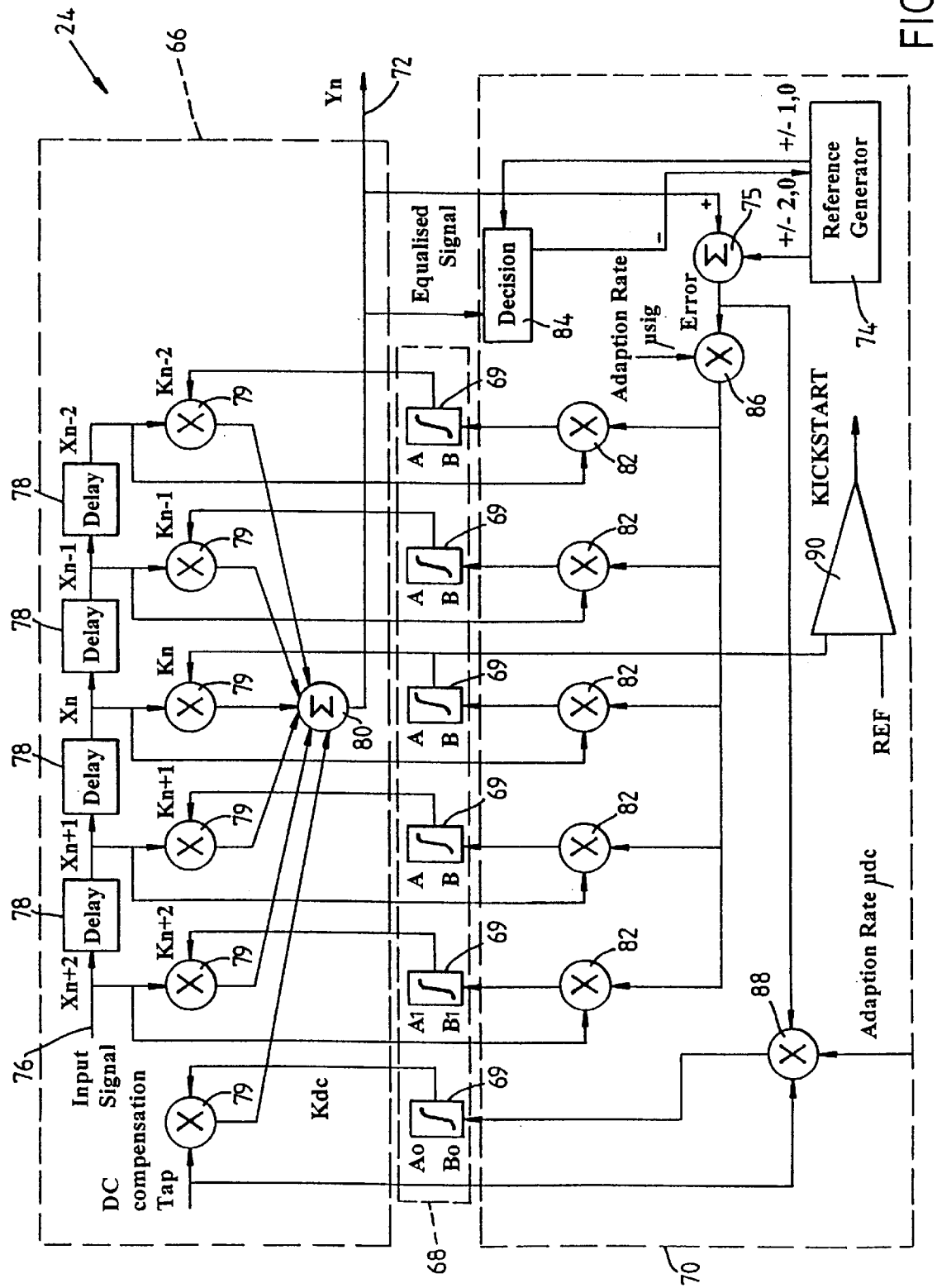
FIG. 3 is a block diagram of a feed forward equaliser (FFE) for use in the apparatus of FIG. 1.

Referring now to FIG. 3, after passing through the AGC block 20, the signal is applied to an FFE 24. The FFE 24 comprises a Finite Impulse Response (FIR) filter 66, a bank 68 of coefficient capacitors 69, and a circuit 70 for adapting the coefficients to reduce the error between the output on line 72 and reference values generated by reference generator 74.

The signal from the AGC block 20 is input into the FIR Filter 66 on a tapped delay line 76 with delays 78 which produce in parallel successively delayed versions of the input. The majority of the circuit elements within the FFE 24 may be implemented in switched capacitor technology. The input at 76 of the FIR filter 66 is sampled by charging a capacitor at the clock time determined by the phase lock loop (PLL) 22. This charge is then passed from one capacitor to another at the bit times to form a delay line. The output at each stage along the delay line is multiplied at a multiplier 79 by a respective weighting coefficient from the associated coefficient capacitor 69, and all the weighted outputs are summed by summer 80 to provide the filter digital output on line 72.

The coefficients in register 68 are repeatedly adapted to maximise the signal to noise ratio (SNR) in the equalised analogue signal on line 72, at the bit sampling times as defined by the phase lock loop 22, while the frequency response of the head and tape, or the head-tape contact conditions vary (either in manufacture or during operation).

In DDS-3 mode the PR-1 input signal will usually be approximately spectrally shaped by the filter 18, and will consist of three levels (+2,0,−2). In this case, in the adaption block 70, the coefficients are adapted in a least mean squares (LMS) algorithm, using an error signal which is the difference between the FIR filter output, and the nearest three level nominal signal level, provided by reference generator 74. The error signal is supplied in parallel to respective multipliers 82 together with the tapped and delayed input signal and this is used to adapt each of the coefficients in the coefficient capacitors 69.

In DDS-3 mode the equalised signal is monitored at 84 to determine whether it is considered to be a +2,0, or −2 signal using a reference from reference generator 74. The reference generator 74 supplies a slicing level signal of ±1 which the decision block 84 uses to decide whether the signal is meant to be +2, 0, or −2. The decision block then causes the reference generator 74 to supply the appropriate +2,0, −2 nominal level to the error summer 75 which also receives the filter output signal to obtain an error signal supplied to the multipliers 82. The rate of adaption may be altered between preset values (typically 6) for the signal ($\mu$sig) and DC coefficient ($\mu$dc), at multipliers 86 and 88.

The FFE 24 must not be allowed to adapt in the preamble or margin regions of the A and B data tracks as it would quickly maladapt away from the optimum coefficient set for the random data region. The beginning and end of the main data region are normally predicted by a data recovery state machine, which uses a combination of timing and intelligent decisions based on the structure of the data on the tape and the knowledge of the format being read, relying inter-alia on the preamble detector 23 (FIG. 1). The preamble detector 23 may be of conventional type, typically in the form of a matched filter matched to the pure sinusoidal tone in the preamble region, and supplying a high output when the signal contains the characteristic sinusoidal tone. The output of the preamble detector 23 is supplied to the state machine 21, which controls the target switching for the A and B preamble and main data targets in the AGC 20, and also selection of the A and B track coefficients in the feed forward equaliser 24, as to be described below.

The spectral characteristics of the A and B tracks differ, and the capacitors 69 store separate coefficients for the A and B tracks, with an appropriate set of coefficients being written to the FFE capacitors 69 at the beginning of each track.

The apparatus includes a set of coefficient registers (not shown) corresponding to the coefficient capacitors 69. The values held on the capacitors 69 can be processed by an A-D convertor and stored in the coefficient registers. For restoring the coefficients at the start of each track they are processed by a digital time log convertor and then supplied to the capacitors. Thus a typical sequence is as follows:

1. The contents of the track A coefficient registers are written to the FFE coefficient capacitors 69.
2. The FFE adapts these coefficients over the A track, according to the adaption process implemented by block 70.
3. The adapted FFE coefficient capacitor 69 values are digitised and stored in the A coefficient registers, and the contents of the B coefficient registers are written to the FFE coefficient capacitors 69.
4. The FFE adapts these coefficients over the B track according to the adaption process implemented by block 70.
5. The adapted FFE coefficient capacitor 69 values for the B track are digitised and stored in the B coefficient registers.

It should however be noted that various other routines may be followed. For example, each track may have its own standard set of coefficients which is loaded into the coefficient capacitors at the beginning of the track, irrespective of the adapted coefficient values at the end of the previous track of that azimuth. The coefficient capacitors are preferably loaded with adapted values taken part way through the previous track of that azimuth. The position at which the coefficients are taken may be optimised according to machine requirements to provide the best adaption. For example if the track is curved it may be best to take coefficients from approximately half-way along the track. For any design of machine, the optimal position may be determined empirically and then production machines programmed to take the coefficients at this point. It would be possible to take the A and B coefficients at different points.

Thus the adapted filter coefficients from the minimum error portions of the read operations for the previous A track may be used as the initial set of coefficients for the next A track and the same process applied to the B track coefficients. To avoid straying into end of track non-linearities, a "snapshot timer" arrangement may be used to pick the coefficient values a predetermined time after the start of the minimum error portion of a read operation.

In one embodiment successive sets of coefficients for a given A or B track may be averaged over many tracks and used as the initial set of coefficients for the next A or B track respectively. This has the advantage that it is possible then to adapt quickly within a track, but slowly over multiple tracks. This may be implemented most easily in a digital scheme.

In a particular embodiment, in each of the A and B track coefficient sets, there are 13 signal coefficients and one DC coefficient.

If the FFE 24 is adapting while it encounters a drop out in the read signal, then the FFE coefficients can maladapt into a state from which they cannot recover. To counter this, an automatic restart mechanism is built in. When the centre coefficient falls below a programmable threshold (e.g. 50%), the coefficients are all forced to a default set of values, for example a unit step impulse response in which the centre signal coefficient is loaded with the value 1 unit and the remaining signal coefficients are forced to zero. From this starting point, the FFE 24 is allowed to continue adapting. It either maladapts again, and the process is then repeated automatically, or it converges to the correct target if the drop out contains recoverable signal.

Thus, in the illustrated embodiment, the centre coefficient is supplied to a comparator 90 which compares it with a value of a preset reference from reference generator 91, and implements a "kick start" routine to force the default set of coefficients if the centre coefficient has fallen below a value which, in practice, is likely to lead to the coefficients stabilising to an incorrect state.

In track-crossing modes, where the track on the tape is misaligned with the scan path of the read head, the head output signal cycles between good and bad SNR many times per scan and in this situation the arrangement of FIG. 3 can increase the amount of data recovered.

It should be noted that a large number of stable, adapted states of the FFE coefficients is possible, but only a small set of these are useful in this scheme. The technique described above tests only the centre coefficient and so cannot detect all possible undesirable states. It will be appreciated however that the technique may be extended to monitor other coefficients in addition to or instead of the centre one and also a different default set of coefficients may be forced. Also ranges rather than single limits may be monitored.

Figure 4:
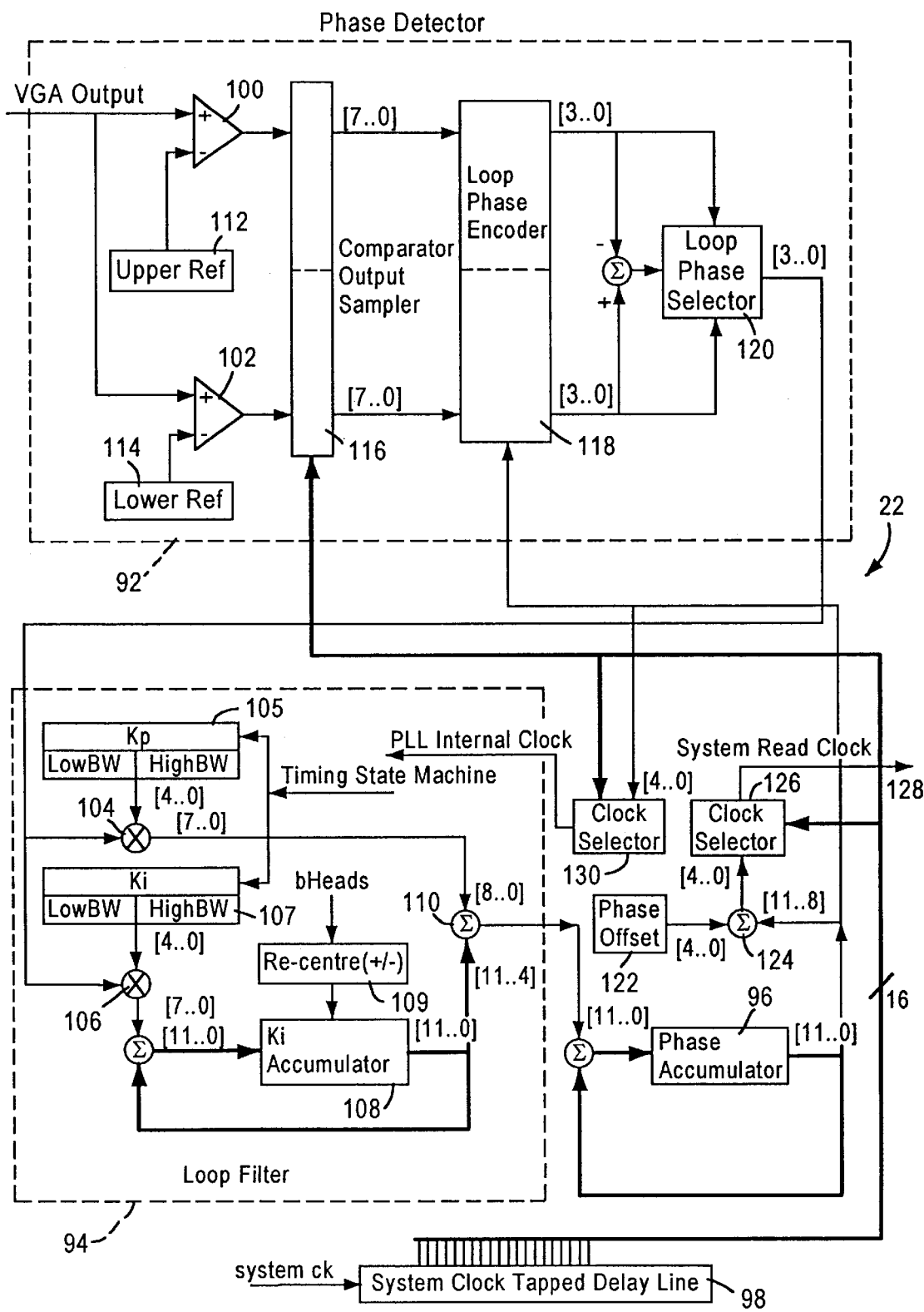
FIG. 4 is a block diagram of a phase lock loop for extracting a clock signal from the input data for use in the apparatus of FIG. 1.

Referring now to FIG. 4, the phase lock loop 22 is required to recover the bit clock from the read-back waveform under a variety of different conditions. Essentially, the phase lock loop 22 must acquire frequency and phase lock at the start of a track and then follow the bit frequency variations caused by head-tape velocity jitter, with a tolerable phase error.

In broad outline, the phase lock loop 22 comprises a phase detector 92, a loop filter 94, and a phase accumulator 96 whose output is used to select the appropriate clock signal from a series thereof available from a system clock tapped delay line 98.

The input signal has been subjected to automatic gain control at AGC 20, so that the nominal levels should be at 2, 0, −2 units. Two input comparators 100, 102, look for times when the input signal crosses a +/−1 unit (approximate) threshold. The times of these threshold crossings are then compared to the current clock time (system read clock) to determine the phase error. The phase error is digitally encoded (i.e. −4, −3, −2, −1, 1, 2, 3, 4 depending on the sign and magnitude of the phase error) and passed to the loop filter 94.

At the loop filter 94, the (digital) phase error is filtered using two multipliers 104, 106 and an accumulator 108. In the upper filtering path, the phase error is multiplied by a constant, Kp. In the lower filtering path, the phase error is multiplied by a constant Ki and the result is accumulated by the Ki accumulator 108. The accumulated (Ki) result and the direct (Kp) result are added together at a summer 110 and passed to the phase accumulator 96.

The phase accumulator 96 integrates the output of the loop filter 94. The upper four bits of the phase accumulator output act as a "pointer" to which of the sixteen delayed versions of the external system clock available at the delay line 98 will be used as the system read clock (i.e. the clock locked to the input signal).

Thus, as the input signal gets out of phase with the system read clock, the phase errors build up to a large value at the output to the loop filter 94, which causes the phase accumulator 96 to increment, eventually changing the upper four bits of its output, which then selects a delayed version of the system clock which is nearer in phase to the input signal.

Referring in more detail to the arrangement, to provide for the optimisation of error rate in the final product, the loop filter parameters are programmable; a second order loop is assumed. In addition, the loop bandwidth is switchable in real time, between two pre-programmed values. This is to make best use of the preamble zones, for acquisition, and still maintain low phase jitter in the data region. The phase lock loop 22 must be able to recover phase lock after signal drop outs that occur during normal replay of a track.

The recovered read clock drives the FFE 24, the ADC 26 and the Viterbi decoder 28, and so must be robust. It is preferred for the phase lock loop 22 to be able to operate in DDS-1/2 or DD-3 formats. DDS-1 or 2 format results in a two-level signal, where the bit sampling time is at the eye centre. Here, the phase detector 92 typically tests for zero crossings, as this method is simple and relatively insensitive to amplitude variations.

In DDS-3 format, reading of the format results in a three-level PR-1 signal. In this case, the phase detector 92 cannot test for simple zero crossings without disqualifying a large proportion of the incoming signal. A threshold crossing scheme is required (approximately +1, −1).

Thus, the PLL 22 contains a threshold-crossing-time phase detector 92, whose output is quantised into discrete steps. In DDS-1 or 2 mode, the phase detector responds to zeros crossings, whereas in DDS-3 mode it responds to half nominal signal levels crossings.

FIG. 4 includes two (conceptual) paths through the phase detector 92, where the input signal (from the AGC 20) is compared at 100, 102 to each of the half nominal signal level threshold levels (positive and negative). The timings of the threshold crossings in the incoming signal are compared at comparator output sampler 116 with eight evenly spaced (⅛th period shifted) phases of the output clock (derived from the 16 tap delay line 98) and at the loop phase encoder 118 to the current output phase selection. The quantised phase is then determined directly by loop phase selector 120 from between which of the eight output clock phases the input crossing falls.

In DDS-1 or 2 mode the input signal is compared to a single nominal zero level reference, and only the upper (conceptual) signal path in FIG. 4 is used. In DDS-3 mode, the half nominal signal thresholds are derived from phase detector threshold reference registers 112, 114, which program DAC references to the AGC random data target DAC references. This arrangement allows the AGC targets, and PLL phase detector references to be independently optimised.

The quantised phase output from the loop phase selector 120 is then fed to a digital loop filter 94, having a Kp (proportional) and Ki (integral) term. For illustration, the phase detector 92 output is shown as a four bit bus (encoding the state {−4,−3,−2,−1,0,1,2,3,4}) and the multiplier 104, 106 outputs as an eight bit bus. The Kp and Ki multipliers may typically have the following ranges:

Kp range =0 . . . 31
Ki range =0 . . . 31
Multiplier output =−124 . . . 124

The Ki multiplier 106 feeds the Ki accumulator 108 which in this example has a range:

Ki accumulator bits =12
Ki accumulator range =−2048 . . . 2047

The Ki accumulator 108 integrates the incoming Ki multiplier outputs, but only the most significant eight bits from the accumulator are added at 110 to the eight bits from the Kp multiplier 104, and then fed to the (least significant) end of the phase accumulator 96.

Thus the loop filter 94 can apply −252 . . . 252 to the phase accumulator 96 per bit period. The two programmable pairs of Kp and Ki values are available in registers 105, 107, to give the loop a fast or slow time constant, which can be selected by a state machine, in accordance with system requirements.

The Ki accumulator 108 is arranged to be reprogrammable when the conditions indicate that it has lost or is in danger of losing phase lock. For example, in the preamble region PLL frequency may be initialised. During so called "stunt modes" a frequency offset will occur where, for fast forward tape motion, the centre frequency of the A tracks may be displaced lower and the B tracks higher, (or vice versa for reverse tape motion). In addition, the Ki accumulator 108 may overflow either positively or negatively, indicating that the centre frequency is outside an acceptable range. Still further the Ki accumulator 108 may be re-centered if the FFE coefficients "Kickstart" routine as referred to above has been triggered. This condition indicates that there is a tape drop out or other disturbance to the signal which suggests that the PLL is likely to lose its phase lock.

Under these conditions, the most significant bits of the Ki accumulator 108 are loaded with the contents of a variable phase oscillator frequency offset register 109, which essentially re-centres the frequency to a default value. For example, the frequency may be re-centered to that with which the PLL 22 started reading the current track.

The digital phase accumulator 96 sums the output of the loop filter 94 and uses the four most significant bits to select an output clock phase from the sixteen tap delay line 98, which itself is phase locked to the system bit frequency clock. The 16 system clock phases from this delay line 98 are also used by the comparator output sampler 116 in the phase detector 92 to perform the timing of threshold crossings. The number of bits passed from the loop filter accumulator 108 to the phase accumulator 96 determines the maximum sustained frequency error that can be supported. The phase accumulator 96 integrates the loop filter 94 output (the sum of the Kp and Ki terms). The most significant four bits are used to select the phase of the system clock from the tapped delay line to be used as the current clock phase.

The output of phase accumulator 96, which can be regarded as a simple unsigned up-down counter, is represented in this example as a twelve bit number. Thus as positive loop filter outputs are applied, the accumulator counts up until it reaches 4095 and then wraps around to zero. Likewise if negative loop filter outputs are applied accumulator counts down until it reaches zero and then wraps around to 4095. Under these conditions, the four most significant bits simply increment from 0 . . . 15 and then wrap around to zero again, so that progressively later phases of the system clock are selected as the output clock.

The tapped delay line 98 has sixteen evenly spaced taps and is fed with the system clock. Conceptually, the delays are adjusted so that the output of the sixteenth tap is coincident with the next system clock period (where the system clock frequency is different for the various operating modes of the channel).

A static phase offset value from a register 122 is incorporated at the summer 124 which provides an output to the clock selector 126 which selects the appropriate clock signal from the tapped delay line 98. There are two contributors to the need for a static phase offset between the phase at which the loop locks, and the clock phase which is applied at the output 128, which is used by the FFE 24 and the ADC 26. Firstly the FFE 24 samples at the bit centres, whereas the PML 22 locks to the bit edges, where the transitions are. Secondly, there are unknown circuit path delays between the phase measuring loop and the point at which the clock is used in the FFE. Accordingly the phase offset register 122 is programmed with a four bit (unsigned) number which is added to the four most significant bits of the phase accumulator to select the clock phase to be passed to the FFE 24, the ADC 26 and the rest of the system, but not the clock phase of the PLL internal clock, which is selected by the clock selector 130.

Although the embodiments of FIGS. 1 to 4 have been described with reference to a sampled analogue scheme, we have also implemented this design in digital form and the invention extends to such digital implementations.

Attention is directed to the commonly assigned co-pending EP Applications Nos. 96306941.4 (HP reference 395009); 96306940.6 (HP reference 395007) and 39606938.0 (HP reference 394090) filed on even date herewith, the contents of which are incorporated herein by reference.

What is claimed is:

1. Apparatus for retrieving from a magnetic tape storage medium signals including user data stored as successive diagonal tracks having alternate first and second azimuths, said apparatus including:
    a head arrangement for successively reading said tracks of alternate first and second azimuths,
    an adaptive equalizer having:
        a coefficient store for storing a set of filter coefficients for the signal read from the tracks of the first azimuth and a set of filter coefficients for the signal read from the tracks of the second azimuth,
        an adaptive filter for applying equalization to the user data signals read from said tracks of the first and second azimuth in accordance with respective sets of adapting filter coefficients and for deriving equalized user data output signals, and
        a coefficient adapter for:
            (a) adapting each of said sets of filter coefficients of the user data signals from said tracks of first and second azimuth in accordance with the derived equalized user data output signals of said adaptive filter, and
            (b) loading in said coefficient store a set of coefficients corresponding to the adapted coefficients derived by the coefficient adapter for use in equalization of a following track of that azimuth, the coefficient store being loaded with adapted coefficient values taken part way through the tracks of the first and second azimuth.

2. The apparatus of claim 1 wherein said coefficient adapter is arranged for storing an adapted set of coefficients corresponding to a minimum error portion of a previous stream of the user data signal.

3. The apparatus of claim 1 wherein said coefficient adapter is arranged for loading said store with an adapted set of coefficients corresponding to those coefficients at a preselected interval after commencement of the tracks.

4. The apparatus of claim 1 wherein said coefficient adapter is arranged for loading said store with a set of coefficients derived from a combination of sets of coefficients from a plurality of previous tracks of that azimuth.

5. The apparatus of claim 4 wherein said combination comprises an average of a plurality of sets of coefficients from tracks of that azimuth.

6. The apparatus of claim 1 wherein said following track is the next track of that azimuth.

7. A method of retrieving a signal including user data stored on a magnetic tape as successive diagonal tracks having alternate first and second azimuths, said method comprising:
    successively reading said user data from the tracks having the first and second azimuths,
    applying the signal read from the tape to an adaptive filter which equalizes the user data using respective sets of filter coefficients according to the azimuth of the track from which the data are read,
    loading a set of adapting filter coefficients in a store for use at the start of a following track of the same azimuth, the loading being of adapted coefficient values taken part way through the tracks of the first and second azimuths, and
    adapting the filter coefficients for the tracks having the first and second azimuths in accordance with the filter coefficients loaded in the store for the tracks having the first and second azimuth coefficients, respectively.

8. The method of claim 7 wherein the following track is the next track of the same azimuth.

* * * * *